(12) United States Patent
Lee et al.

(10) Patent No.: US 8,594,254 B2
(45) Date of Patent: Nov. 26, 2013

(54) WAVEFORM INTERPOLATOR ARCHITECTURE FOR ACCURATE TIMING RECOVERY BASED ON UP-SAMPLING TECHNIQUE

(75) Inventors: Jaewook Lee, Irvine, CA (US); Umang Mehta, Irvine, CA (US); Jerry Hodges, Riverside, CA (US)

(73) Assignee: Quantum Corporation, San Jose, CA (US)

( * ) Notice: Subject to any disclaimer, the term of this patent is extended or adjusted under 35 U.S.C. 154(b) by 388 days.

(21) Appl. No.: 12/891,647

(22) Filed: Sep. 27, 2010

(65) Prior Publication Data

US 2012/0076244 A1      Mar. 29, 2012

(51) Int. Cl.
 *H04L 25/08* (2006.01)
 *H04L 27/28* (2006.01)
(52) U.S. Cl.
 USPC .......................................... 375/346; 375/260

(58) Field of Classification Search
 USPC .......... 375/346, 260, 340, 348, 371; 327/158, 327/277; 332/109; 348/448
 See application file for complete search history.

(56) References Cited

U.S. PATENT DOCUMENTS

| | | | |
|---|---|---|---|
| 2007/0073545 A1* | 3/2007 | Tashiro | 704/500 |
| 2008/0069256 A1* | 3/2008 | Lakkis | 375/260 |
| 2009/0257542 A1* | 10/2009 | Evans et al. | 375/375 |

OTHER PUBLICATIONS

Kim, Dae Young, "Synchronization for all digital receivers," *Department of Electrical Engineering, Stanford University*, PhD dissertation, Jan. 1997.

* cited by examiner

*Primary Examiner* — Khai Tran
(74) *Attorney, Agent, or Firm* — Baker Botts L.L.P.

(57) ABSTRACT

In one embodiment, an interpolator-based timing recovery system improves accuracy by calculating additional sampled signals of a digital signal and generating an interpolation based on the additional sampled signals and the digital signal, while employing a parallel architecture to maintain system clock frequency and a pipeline architecture to minimize sampled data memory requirement.

20 Claims, 6 Drawing Sheets

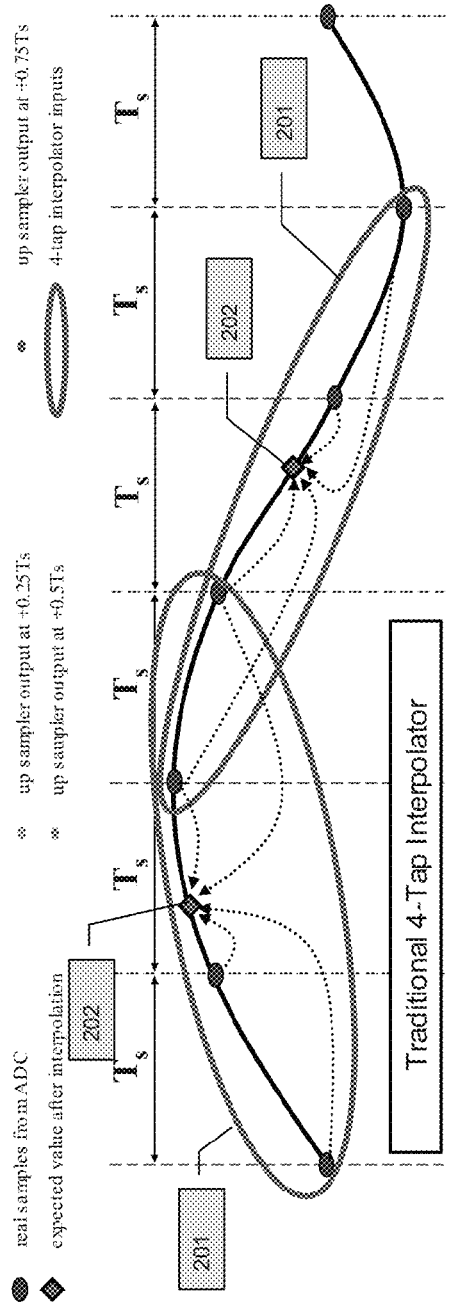
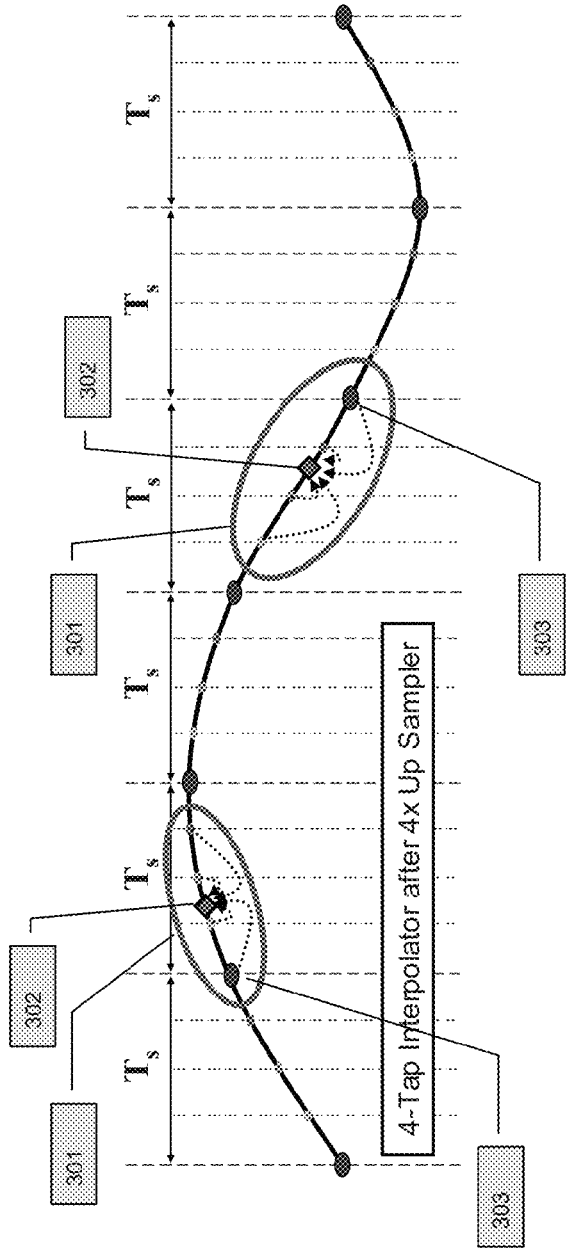

WAVEFORM INTERPOLATOR ARCHITECTURE FOR ACCURATE TIMING RECOVERY BASED ON UP-SAMPLING TECHNIQUE

TECHNICAL FIELD

The present disclosure generally relates to an interpolator-based timing recovery system.

BACKGROUND

An interpolation filter or interpolator is a filter that converts a sampled digital signal to a different sampling rate ("data rate") using various digital filtering techniques (e.g., polynomial interpolator, windowed sinc interpolator). An interpolator in an interpolator-based timing recovery system receives a digital signal from an analog-to-digital converter, converts the digital signal to a data rate and transmits the converted or interpolated signal to a data detector or an equalizer. The interpolator-based timing recovery system can be used, among other components, in disk, tape, optical, networking, or other digital data recovery channels, for example, in a read channel of a magnetic tape storage system.

SUMMARY

Particular embodiments relates to improving the accuracy of an interpolator-based timing recovering system by calculating additional sampled signals of a digital signal and generating an interpolation based on the additional sampled signals and the digital signal, while employing a parallel architecture to maintain system clock frequency and a pipeline architecture to minimize sampled data memory requirements.

These and other features, aspects, and advantages of the disclosure are described in more detail below in the detailed description and in conjunction with the following figures.

BRIEF DESCRIPTION OF THE DRAWINGS

FIG. 2 illustrates an example waveform of a 4-tap interpolator.

FIG. 3 illustrates an example waveform of a 4× up-sampling interpolator.

FIG. 6A illustrates an example of mapping table between re-arranged sampled signals and input to a 4-tap interpolator.

DETAILED DESCRIPTION

The present disclosure is now described in detail with reference to a few embodiments thereof as illustrated in the accompanying drawings. In the following description, numerous specific details are set forth in order to provide a thorough understanding of the present disclosure. It is apparent, however, to one skilled in the art, that the present disclosure may be practiced without some or all of these specific details. In other instances, well known process steps and/or structures have not been described in detail in order not to unnecessarily obscure the present disclosure. In addition, while the disclosure is described in conjunction with the particular embodiments, it should be understood that this description is not intended to limit the disclosure to the described embodiments. To the contrary, the description is intended to cover alternatives, modifications, and equivalents as may be included within the spirit and scope of the disclosure as defined by the appended claims.

Figure 1:
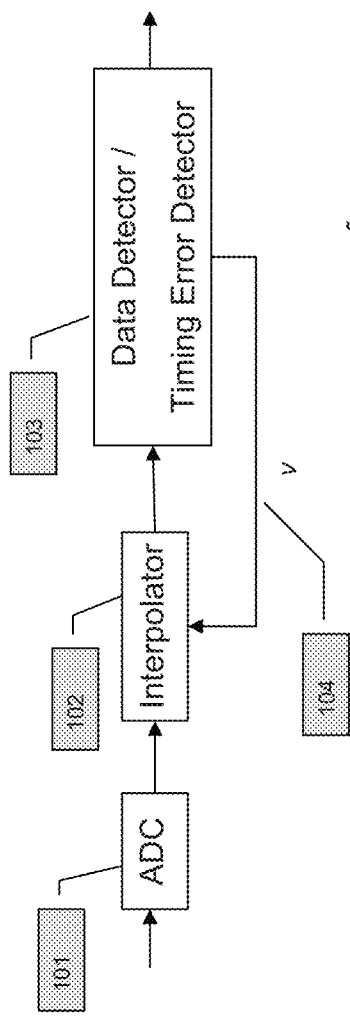
FIG. 1 illustrates an example of interpolator-based timing recovery (ITR) system.

An interpolation filter or interpolator is a filter that converts a sampled digital signal to a different rate ("data rate") using various digital filtering techniques (e.g., polynomial interpolator, windowed sinc interpolator). FIG. 1 illustrates an example interpolator-based timing recovery (ITR) system. In FIG. 1, interpolator 102 receives a digital signal from analog-to-digital converter 101 (ADC), converts the digital signal to a data rate and transmits the converted or interpolated signal to data detector (or timing error detector) 103. Data detector 103 provides a feedback signal v (104) to interpolator 102, where v determines an offset into a current cycle of sampling in which an interpolation is to be made. The circuit illustrated in FIG. 1 may be used, among other components, in disk, tape, optical, networking, or other digital data recovery channels, for example, in a read channel of a magnetic tape storage system.

Interpolator-based timing recovery systems may use a 4-tap cubic interpolator at a high over-sampling rate (OSR)—for example, at OSR of 1.5—because the 4-tap cubic interpolator can demonstrate good performance with low complexity at high OSR. In comparison, a minimum mean square error (MMSE) interpolator can achieve a theoretical performance bound of an interpolator but is undesirable in an interpolator-based timing recovery system due to its complexity and the requirement for accurate knowledge in system and noise characteristics; a parabolic interpolator can be slightly better than a cubic interpolator but requires proper tuning of its parameters.

Figure 1A:
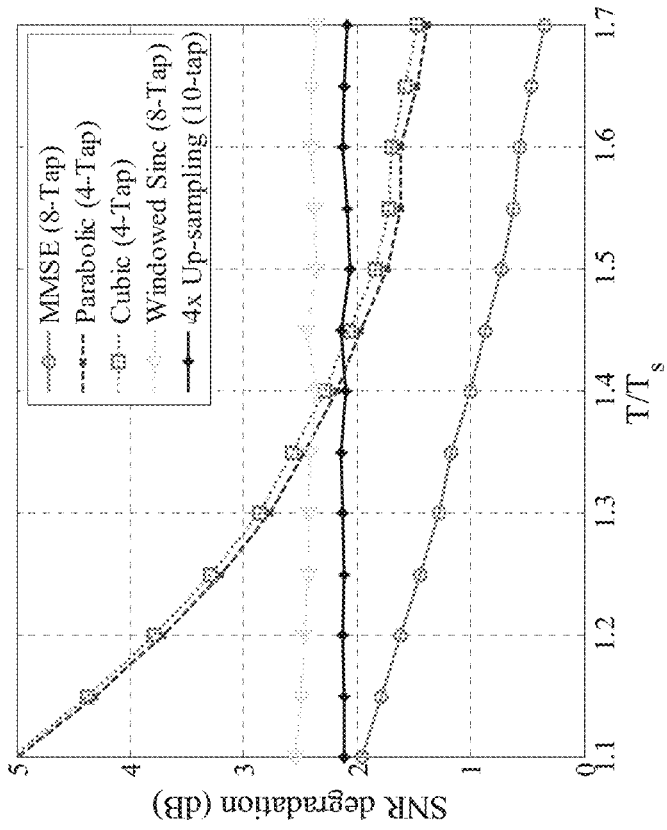
FIG. 1A illustrates an example in signal-to-noise ratio (SNR) degradation of various interpolators with respect to over-sampling ratio.

However, the 4-tap cubic interpolator's performance degrades at lower over-sampling rate. FIG. 1A illustrates an example in signal-to-noise ratio (SNR) degradation of various interpolators with respect to over-sampling ratio. FIG. 1A shows the relative performance of various interpolators modeled by simulations with additive white Gaussian noise (AWGN) model at a signal SNR of 15 dB. In FIG. 1A, the 4-tap cubic interpolator shows the worst performance (i.e., highest SNR degradation) at lower OSR (below 1.35). In contrast, a windowed sinc interpolator (WSI) and a 4× up-sampling interpolator have almost constant SNR performance regardless of over-sampling ratio as in FIG. 1A, yet the windowed sinc interpolator has less optimal performance, and the 4× up-sampling interpolator requires higher system clock frequency and more data memory for storing sampled data. Certain embodiments described herein include an interpolator-based timing recovery system with low over-sampling rate, employing a parallel architecture to maintain system clock frequency and a pipeline architecture to minimize sampled data memory requirement.

FIG. 2 illustrates an example waveform of a 4-tap interpolator. For FIG. 2, the 4-tap interpolator receives from an ADC data samples spaced by a sampling interval Ts. Ordinarily, the 4-tap interpolator can calculate a timing-recovered waveform 202 based on four sampled data points from the ADC, as circled by 201.

FIG. 3 illustrates an example waveform of a 4× up-sampling interpolator. In particular embodiments, a 4× up-sampling interpolator may receive from an ADC data samples spaced by a sampling interval Ts. In particular embodiments, the 4× up-sampling interpolator may calculate a timing-recovered waveform 302 based on a particular data point (303) from the ADC and three data points calculated from the particular data point from the ADC, as circled by 301. In particular embodiments, the 4× up-sampling interpolator may calculate the three data points by calculating wave forms at different phase shifts from the particular data points. In particular embodiments, the three calculated data points and the particular data point may be four consecutive data points spaced by a same phase shift. For example, the three calculated data points can have phase shifts of 0.25, 0.5, and 0.75 from the particular data point. For example, the three calculated data points can have phase shifts of −0.25, 0.25, and 0.5 from the particular data point.

Figure 4:
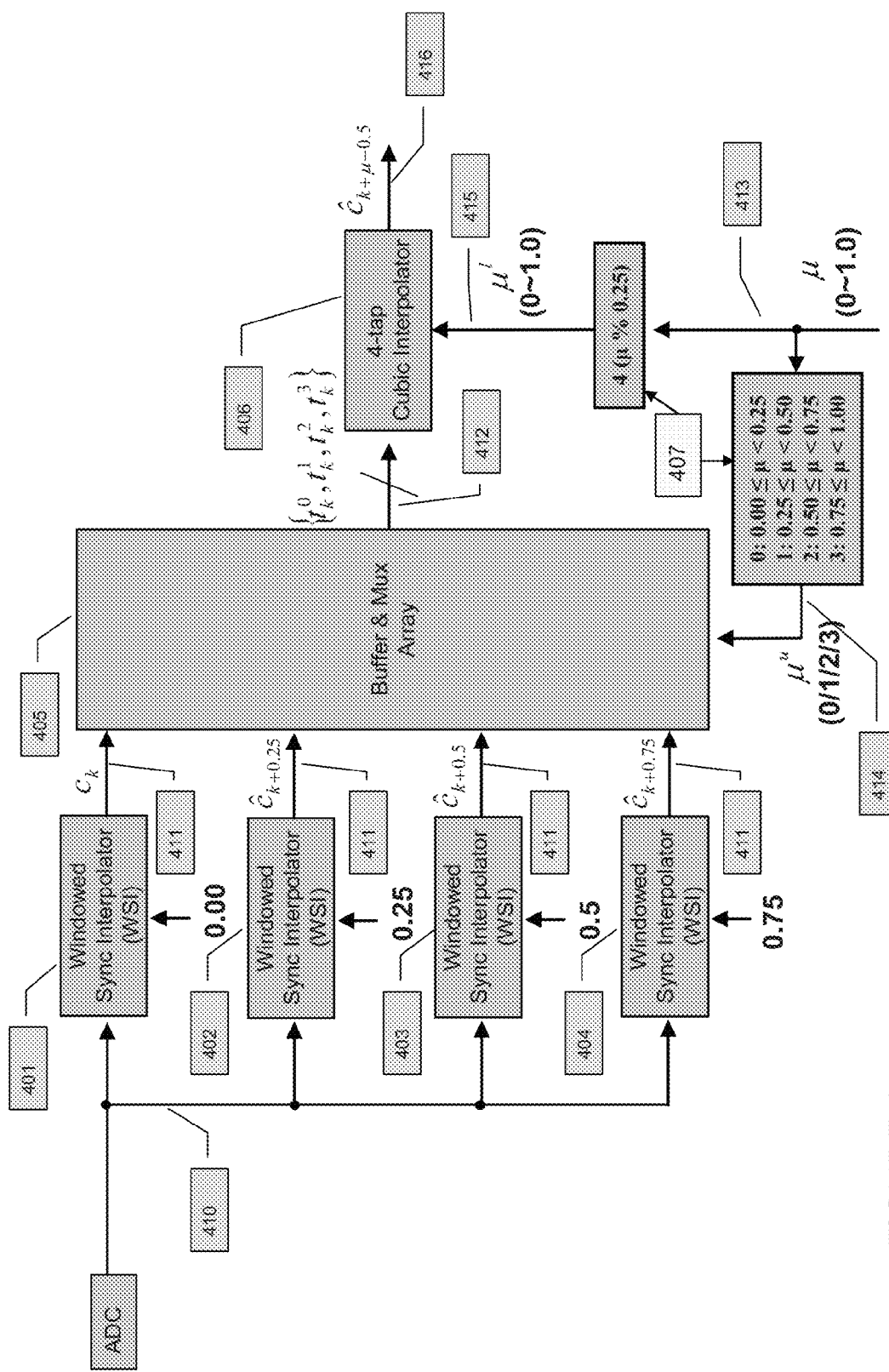
FIG. 4 illustrates an example of a 4× up-sampling interpolator.

FIG. 4 illustrates an example of a 4× up-sampling interpolator. In particular embodiments, four waveform interpolators (401, 402, 403, and 404) in parallel may receive digital signal 410. In particular embodiments, digital signal 410 may be a digital output from an analog to digital converter. In particular embodiments, each of waveform interpolators 401, 402, 403, and 404 may calculate a sampled signal 411 at a different phase shift from digital signal 410, respectively. In particular embodiments, waveform interpolators 401, 402, 403 and 404 may have consecutive, equally spaced phase shifts. For example, waveform interpolators 401, 402, 403, and 404 can have phase shifts of 0.0, 0.25, 0.5, and 0.75, respectively, from digital signal 410. In particular embodiments, a waveform interpolator having a phase shift of 0.0 may be a zero-phase-shift component, i.e., an output of such waveform interpolator is a sampled signal of digital signal 410 without calculation or interpolation.

In particular embodiments, each of waveform interpolators 401, 402, 403, and 404 may be a windowed sinc interpolator. As shown in FIG. 1A, a windowed sinc interpolator can have good performance at lower over sampling ratio. In particular embodiments, a windowed sinc interpolator having a phase shift of 0.0 may be a zero-phase-shift component.

In particular embodiments, buffer and multiplexer array 405 may re-arrange and select a set of sampled signals 411 as tap signal 412. In particular embodiments, 4-tap interpolator 406 may receive tap signals 412 and calculate a timing-recovered waveform 416 based on tap signals 412. As in the above example of waveform interpolators 401, 402, 403, and 404 having phase shifts of 0.0, 0.25, 0.5 and 0.75, respectively, from digital signal 410, waveform interpolators 401, 402, 403, and 404 can calculate sampled signals $C_k$, $\hat{C}_{k+0.25}$, $\hat{C}_{k+0.5}$, and $\hat{C}_{k+0.75}$ based on digital signal 410 and respective phase shifts. Buffer and multiplexer array 405 can re-arrange the sampled signals $C_k$, $\hat{C}_{k+0.25}$, $\hat{C}_{k+0.5}$, and $\hat{C}_{k+}0.75$ and select a set of tap signals $t_k^0$, $t_k^1$, and $t_k^2$, $t_k^3$. comprising of the re-arranged sampled signals as input to 4-tap interpolator 406. 4-tap interpolator 406 can calculate a timing-recovered waveform 416 based on the tap signals $t_k^0$, $t_k^1$, $t_k^2$, and $t_k^3$.

The over sampling rate (OSR) at input to 4-tap interpolator 406 can be very high due to 4× up-sampling by waveform interpolators 401, 402, 402, and 403, meanwhile, a 4-tap cubic interpolator can have good performance at high OSR as shown in FIG. 1A. In particular embodiments, 4-tap interpolator 406 may be a 4-tap cubic interpolator.

In particular embodiments, control logic 407 may generate multiplexer control signal $\mu^u$ (414) and 4-tap interpolator control signal $\mu^l$ (415) based on phase offset $\mu$ (413). In particular embodiments, phase offset $\mu$ 413 may be a feedback signal from a data detector in an interpolator-based timing recovery system. In particular embodiments, phase offset 413 may be a feedback signal from a timing-error detector in an interpolator-based timing recovery system.

For example, control logic 407 can generate a multiplexer control signal $\mu^u$ as follows:

$\mu^u=0$, if $0.00 \le \mu < 0.25$ $\mu^u=0$, if $0.25 \le \mu < 0.50$ $\mu^u=0$, if $0.50 \le \mu < 0.75$ $\mu^u=0$, if $0.75 \le \mu < 1.00$

For example, control logic 407 can generate a 4-tap interpolator control signal $\mu^l$ as follows:

$\mu^l = 4 \times (\mu \% 0.25)$ wherein % is the modulo operation.

The example multiplexer control signal $\mu^u$ and 4-tap interpolator control signal $\mu^l$ above can be implemented in hardware. For example, if the phase offset $\mu^u$ is an unsigned N-bit fixed point number, the multiplexer control signal $\mu^u$ can be the upper two bits of the N-bit number (e.g., first two bits if N is 4), and the 4-tap interpolator control signal $\mu^l$ can be the lower N-2 bits of the N-bit number (e.g., last two bits if N is 4).

Figure 5:
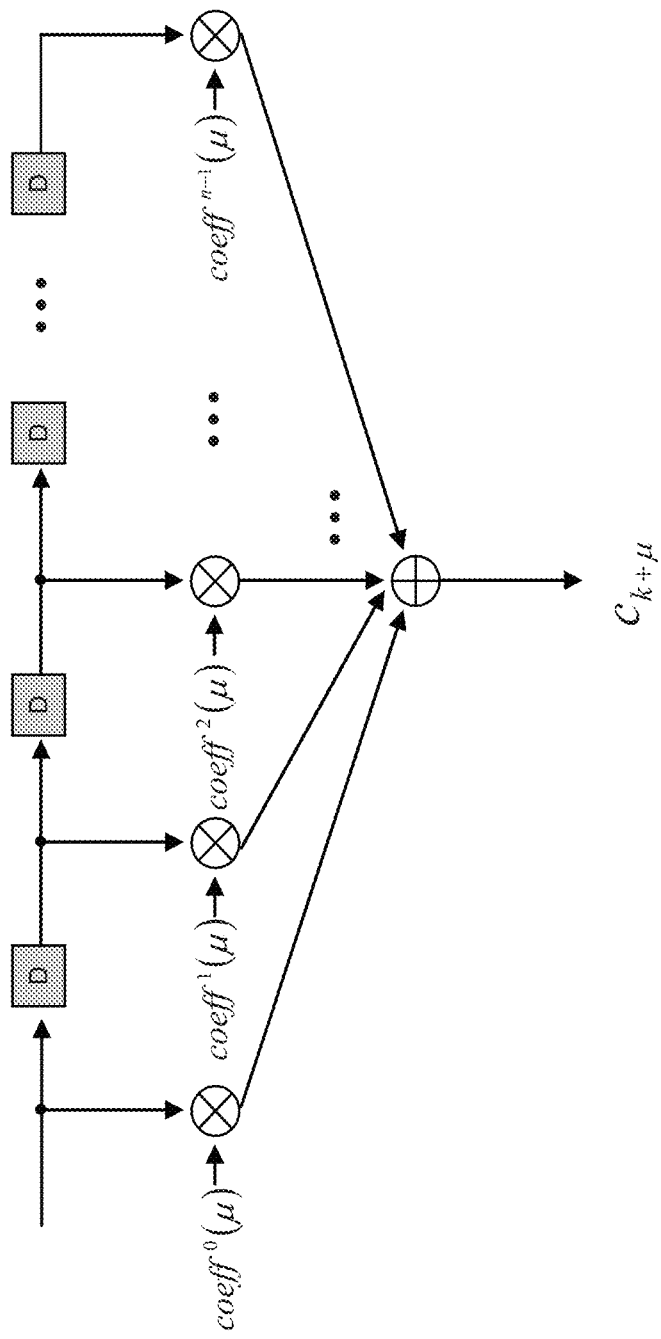
FIG. 5 illustrates an example of a windowed sinc interpolator.

FIG. 5 illustrates an example of a windowed sinc interpolator. In particular embodiments, a windowed sinc interpolator may employ a finite impulse response (FIR) structure and have a plurality of shift registers to generate tap values and tap coefficients controlled by a phase offset signal $\mu$. In particular embodiments, the windowed sinc interpolator may calculate an output as a sum of products of the tap values and the tap coefficients.

Figure 6:
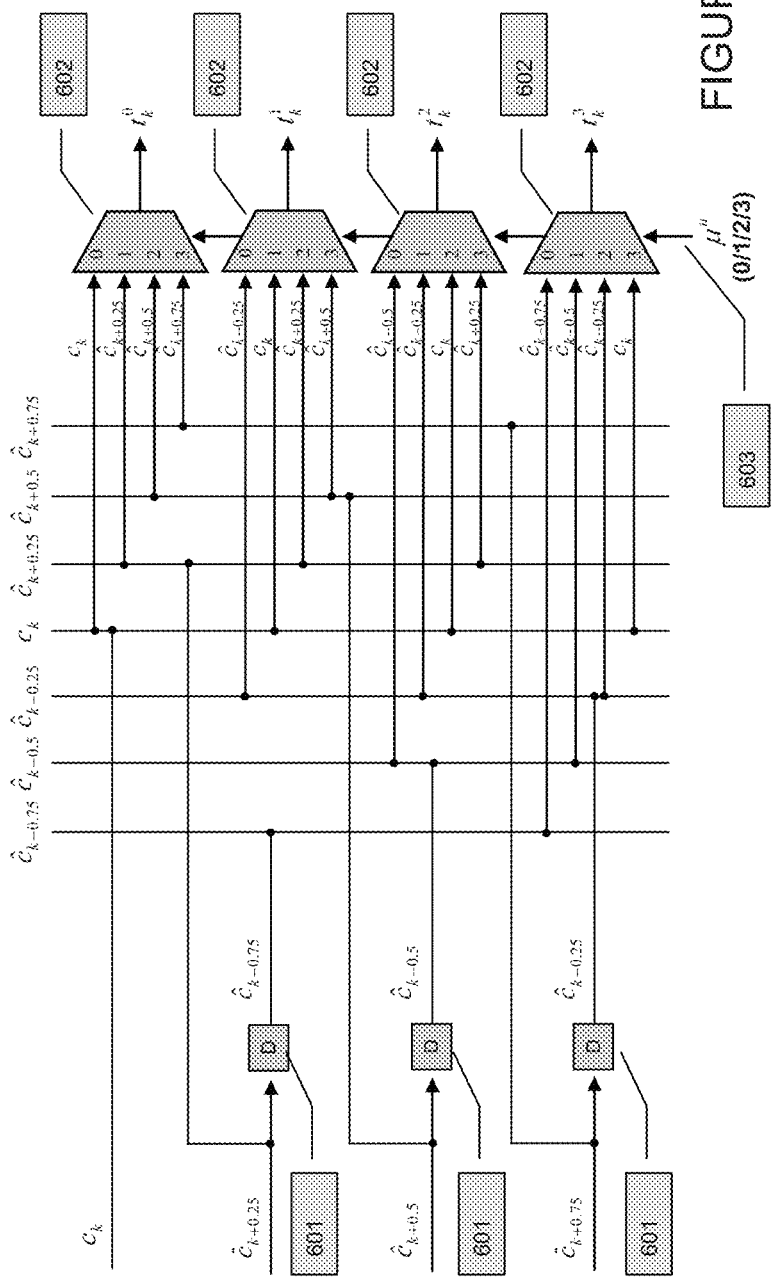
FIG. 6 illustrates an example of a buffer and multiplexer array.

FIG. 6 illustrates an example of a buffer and multiplexer array. In particular embodiments, a buffer and multiplexer array may comprise a plurality of shift registers (601) and a plurality of multiplexers (602). In particular embodiments, the plurality of shift registers may re-arrange sampled signals 411, and control signal 603 to the plurality of multiplexers may enable selection of a set of re-arranged sampled signals as a 4-tap interpolator's input (412).

As in the above example of waveform interpolators 401, 402, 403, and 404 having phase shifts of 0.0, 0.25, 0.5 and 0.75, respectively, from digital signal 410, buffer and multiplexer array 405 can have three shift registers 601 and four multiplexers 602. The three shift registers 601 can re-arrange the input sampled signals ($C_k$, $\hat{C}_{k+0.25}$, $\hat{C}_{k+0.5}$, and $\hat{C}_{k+0.75}$) (411) to four sets of sampled signals, each set of the four sets of sampled signals can comprise four consecutive sampled signals spaced by a same phase shift. In other words, the shift registers can store certain values in a first cycle to be used in a subsequent cycle to maintain a sliding window of values. For example, the four sets of sampled signals can be $\{C_k, \hat{C}_{k-0.25}, \hat{C}_{k-0.5}, \hat{C}_{k-0.75}\}$, $\{\hat{C}_{k+0.25}, C_k, \hat{C}_{k-0.25}, \hat{C}_{k-0.5}\}$, $\{\hat{C}_{k+0.5}, \hat{C}_{k+0.25}, C_k, \hat{C}_{k-0.25}\}$, and $\{\hat{C}_{k+0725}, \hat{C}_{k+0.5}, \hat{C}_{k+0.25}, C_k\}$. Multiplexer control signal $\mu^u$ (414) of the four multiplexers 602 can select one of the four sets of sampled signals and map the selected one set to tap signals $t_k^0$, $t_k^1$, $t_k^2$, and $t_k^3$ (412) as input to 4-tap interpolator 406. FIG. 6A illustrates an example of mapping table between re-arranged sampled signals and input to a 4-tap interpolator.

Figure 7:
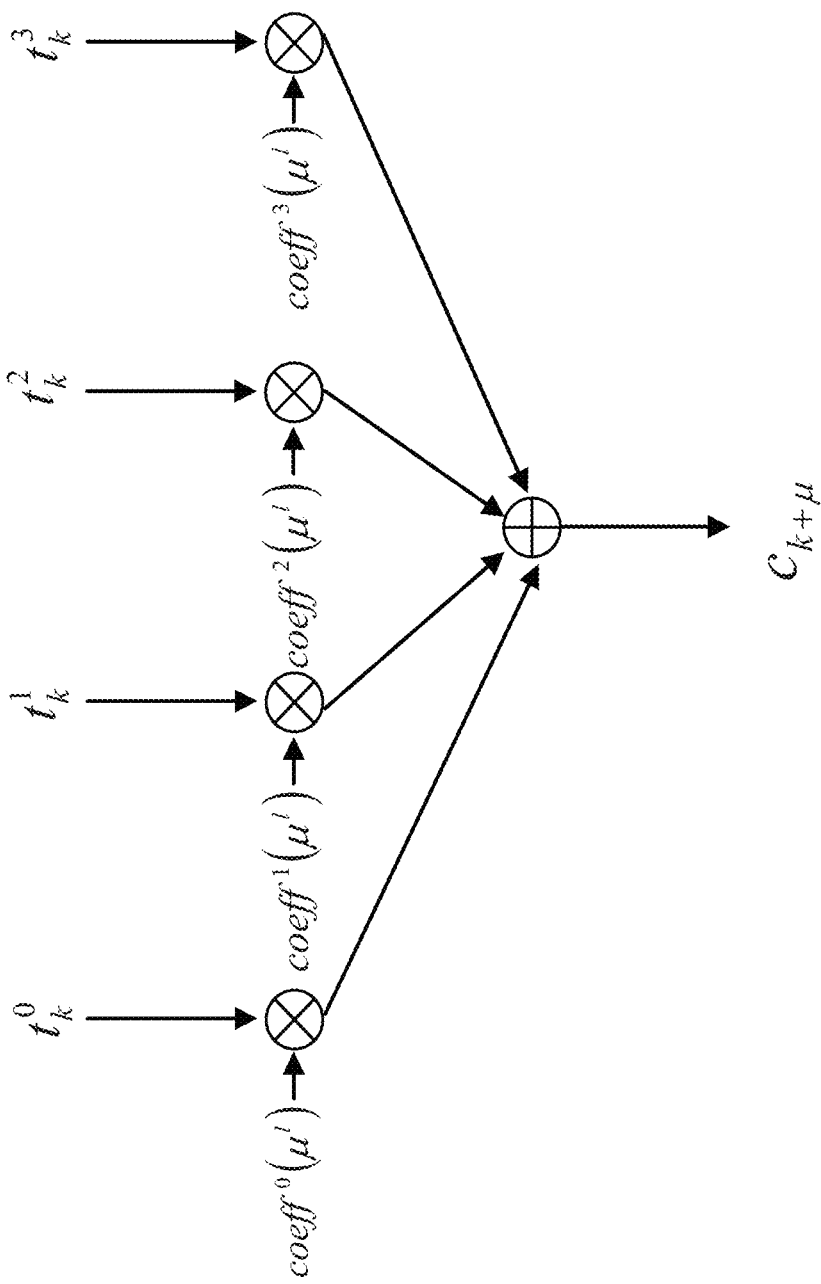
FIG. 7 illustrates an example of a 4-tap cubic interpolator.

FIG. 7 illustrates an example of a 4-tap cubic interpolator. Since tap values for a 4-tap cubic interpolator in current invention are available simultaneously to the 4-tap cubic interpolator as enabled by the four windowed sinc interpolator in parallel and the pipeline structure of the buffer and multiplexer array, the 4-tap cubic interpolator in current invention does not require shift registers in a traditional 4-tap cubic interpolator. In particular embodiments, the 4-tap cubic interpolator may calculate a output as a sum of products of input tab signals (e.g., $t_k^0, t_k^1, t_k^2,$ and $t_k^3$), and tab coefficients (e.g., $coeff^0(\mu^1), coeff^1(\mu^1), coeff^2(\mu^1),$ and $coeff^3(\mu^1)$, augmented by a 4-tab interpolator control signal (e.g., $\mu^1$).

The above embodiments can also be implemented with N waveform interpolators in parallel, given a desired accuracy of a target application. For example, N can be 2, 4, 8, or 16. In particular embodiments, N waveform interpolators in parallel may receive a digital signal. In particular embodiments, the digital signal may be a digital output from an analog to digital converter. In particular embodiments, each of the N waveform interpolators may calculate a sampled signal at a different phase shift from the digital signal. In particular embodiments, the N waveform interpolators may have consecutive, equally spaced phase shifts. For example, if N is 8, the 8 waveform interpolators can have phase shifts of 0.0, 0.125, 0.25, 0.375, 0.5, 0.625, 0.75, and 0.875 from the digital signal. In particular embodiments, a buffer and multiplexer array, comprising a plurality of shift registers and a plurality of multiplexers, may re-arrange and select a set of the sampled signals as input to a P-tap interpolator. In particular embodiments, the N-tap interpolator may calculate a timing-recovered waveform base on the N tap signals.

The components included in a 4× up-sampling interpolator (e.g., windowed sinc interpolator, buffer and multiplexer array, or 4-tap cubic interpolator) may be implemented as software, firmware, hardware, or a combination thereof. For example, the windowed sinc interpolator, the buffer and multiplexer array, and the 4-tap cubic interpolator may each be implemented as Integrated Circuits (ICs) using suitable designs such as, for example, Field-Programmable Gate Array (FPGA), Application-Specific Instruction-Set Processor (ASIP), ASIC, or Complex Programmable Logic Device (CPLD). Functional logic may be embedded in such ICs so that each component may perform the necessary operations (e.g., the windowed sinc interpolator may be programmed to calculate sampled signals, the buffer and multiplexer array may be programmed to map sampled signals to the 4-tap cubic interpolator' input, and the 4-tap cubic interpolator may be programmed to calculate a timing-recovered waveform).

It will be appreciated that, for clarification purposes, the above description describe particular embodiments with reference to different functional units and processors. However, it will be apparent that any suitable distribution of functionality between different functional units, processors, or domains may be used without detracting from the disclosure. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization. Additionally, although a feature may appear to be described in connection with particular embodiments, one skilled in the art would recognize that various features of the described embodiments may be combined in accordance with the invention.

Furthermore, although the present disclosure describes or illustrates particular operations as occurring in a particular order, the present disclosure contemplates any suitable operations occurring in any suitable order. Moreover, the present disclosure contemplates any suitable operations being repeated one or more times in any suitable order. Although the present disclosure describes or illustrates particular operations as occurring in sequence, the present disclosure contemplates any suitable operations occurring at substantially the same time, where appropriate. Any suitable operation or sequence of operations described or illustrated herein may be interrupted, suspended, or otherwise controlled by another process, such as an operating system or kernel, where appropriate. The acts can operate in an operating system environment or as stand-alone routines occupying all or a substantial part of the system processing.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

What is claimed is:

1. An apparatus comprising:
   a plurality of first waveform interpolators wherein each of the plurality of first waveform interpolators is operable to calculate a different sampled signal of a first digital signal;
   a buffer and multiplexer array operable to re-arrange and select a set of calculated sampled signals of the first digital signal by the plurality of waveform interpolators; and
   a second waveform interpolator operable to generate a second digital signal based on an interpolation of the selected set of calculated sampled signals of the first digital signal.

2. The apparatus of claim 1 wherein each of the plurality of first waveform interpolators is operable to calculate a different sampled signal of a first digital signal by calculating a waveform at a different phase shift of the first digital signal.

3. The apparatus of claim 1 wherein the calculated sampled signals of the first digital signal by the plurality of first waveform interpolators are consecutive data points spaced by a same phase shift.

4. The apparatus of claim 1 wherein a buffer and multiplexer array operable to re-arrange and select a set of calculated sampled signals of the first digital signal by the plurality of first waveform interpolators further comprises:
   a plurality of shift registers operable to store certain values of the calculated sampled signals in a first cycle to be used in a subsequent cycle to maintain a sliding window of values of the calculated sampled signals; and
   a plurality of multiplexers operable to select a particular instance of the sliding window of values of the calculated sampled signals as the selected set of calculated sampled signals of the first digital signal by the plurality of first waveform interpolators.

5. The apparatus of claim 1 wherein one or more of the plurality of first waveform interpolators is a windowed sine interpolator.

6. The apparatus of claim 1 wherein one or more of the plurality of first waveform interpolators is a zero-phase-shift component.

7. The apparatus of claim 1 wherein the second waveform interpolator is a cubic interpolator.

8. The apparatus of claim 1 wherein the first digital signal is a digital output of a analog-to-digital converter.

9. The apparatus of claim 2 wherein selecting a set of calculated sampled signals of the first digital signal by the plurality of first waveform interpolators is augmented by a control signal to the plurality of multiplexers.

10. The apparatus of claim 9 wherein the control signal is a feedback signal from a data detector in a timing-recovery system.

11. The apparatus of claim 9 wherein the control signal is a feedback signal from a timing error detector in a timing-recovery system.

12. A method comprising:
calculating, using a plurality of first waveform interpolators, a plurality of sampled signals from a first digital signal, wherein each of the plurality of first waveform interpolators is operable to calculate a different sampled signal of a first digital signal by calculating a waveform at a different phase shift of the first digital signal;
re-arranging and selecting, using a buffer and multiplexer array, a set of calculated sampled signals of the first digital signal by the plurality of waveform interpolators; and
generating, using a second waveform interpolator, a second digital signal based on an interpolation of the selected set of calculated sampled signals.

13. The method of claim 12 wherein the calculated sampled signals of the first digital signal by the plurality of first waveform interpolators are consecutive data points spaced by a same phase shift.

14. The method of claim 12 wherein one or more of the plurality of first waveform interpolators is a windowed sine interpolator.

15. The method of claim 12 wherein one or more of the plurality of first waveform interpolators is a zero-phase-shift component.

16. The method of claim 12 wherein the second waveform interpolator is a cubic interpolator.

17. The method of claim 12 wherein the first digital signal is a digital output of a analog-to-digital converter.

18. The method of claim 12 wherein selecting a set of calculated sampled signals of the first digital signal by the plurality of first waveform interpolators is augmented by a control signal to the plurality of multiplexers.

19. The method of claim 18 wherein the control signal is a feedback signal from a data detector in a timing-recovery system.

20. The method of claim 18 wherein the control signal is a feedback signal from a timing error detector in a timing-recovery system.

* * * * *